(12) United States Patent
Andrews et al.

(10) Patent No.: US 7,616,029 B1
(45) Date of Patent: Nov. 10, 2009

(54) HYSTERESIS-BASED PROCESSING FOR APPLICATIONS SUCH AS SIGNAL BIAS MONITORS

(75) Inventors: William B. Andrews, Emmaus, PA (US); Phillip Johnson, Hellertown, PA (US); John Schadt, Bethlehem, PA (US); Harold Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 106 days.

(21) Appl. No.: 11/869,019

(22) Filed: Oct. 9, 2007

(51) Int. Cl.
*H03K 5/22* (2006.01)
(52) U.S. Cl. .......................................... 327/63; 327/72
(58) Field of Classification Search .................. 327/63, 327/64, 68, 72, 77, 78
See application file for complete search history.

(56) References Cited

U.S. PATENT DOCUMENTS

| | | | |
|---|---|---|---|
| 5,841,283 A * | 11/1998 | Bloemen ............... 324/399 |
| 5,943,272 A * | 8/1999 | Chang ................. 365/189.09 |
| 6,549,032 B1 | 4/2003 | Shumarayev et al. ........ 326/33 |
| 6,756,820 B1 * | 6/2004 | Heyne et al. ............... 326/106 |
| 6,972,593 B1 | 12/2005 | Wang et al. ................ 326/56 |
| 7,177,375 B2 * | 2/2007 | Wahl et al. .................. 375/340 |

\* cited by examiner

*Primary Examiner*—Quan Tra
(74) *Attorney, Agent, or Firm*—Mendelsohn, Drucker, & Associates, P.C.

(57) ABSTRACT

In one embodiment of the invention, a bias signal monitor has two signal comparators that compare two (power supply) voltages at two different bias points and a logic circuit that processes the outputs from the two signal monitors to generate a bias signal monitor output signal. The logic circuit implements hysteresis-based processing such that (1) if both signal comparators are active (indicating that a first voltage is greater than the second voltage relative to both bias points), then the monitor output is active, (2) if both signal comparators are inactive (indicating that the first voltage is not greater than the second voltage relative to either bias point), then the monitor output is inactive, and (3) if one signal comparator is active and the other is inactive, then the monitor output keeps its previous value. This hysteresis characteristic prevents relatively small oscillations between the voltages from changing the monitor output.

10 Claims, 3 Drawing Sheets

100

102

104

400

500

HYSTERESIS-BASED PROCESSING FOR APPLICATIONS SUCH AS SIGNAL BIAS MONITORS

TECHNICAL FIELD

The present invention relates to electronics, and, in particular, to hysteresis-based processing for electronic applications such as signal bias monitors for electronic devices.

BACKGROUND

In certain electronic devices, input/output (I/O) buffers have multiple power supplies, possibly providing different voltage levels. During initial power-on of such an electronic device, because different power supplies may be driven high at different start times and at different ramp rates, it may be important to monitor the relative relationship between the levels of the multiple power supplies, e.g., in order to minimize power dissipation, bus contention in hot-socket applications, and noise due to oscillations of the bias networks. The outputs of such monitoring circuits are used as control signals for the I/O buffers as well as for other sections of the electronic device to intermittently control the state of the circuitry to meet the device's specifications. Noise on the power supplies and the different ramp rates at which they rise can cause the monitors to oscillate around their bias switch points, resulting in noise in the outputs of the monitoring circuits, increased power dissipation within the monitoring circuits, and indeterminate states of the circuits being controlled.

Prior-art techniques to monitor the relative relationship between two power supply levels use a single bias-point monitor that can cause oscillations if the power supplies have noise or are unstable. With one bias monitor, the monitoring circuit can oscillate, even with very little input noise, if the supply voltages are close to the switch bias point. Biasing such a monitor to default to one of the power supplies may protect the circuit from oscillating, but it may also cause the circuit to select the wrong power supply under certain conditions, which can lead to possible damage, excessive power draw, and bus contention.

SUMMARY

In one embodiment of the present invention, an integrated circuit has a signal bias monitor comprising first and second bias comparators and logic circuitry. The first bias comparator is connected to compare first and second voltages relative to a first bias point to generate a first comparison output. The second bias comparator is connected to compare the first and second voltages relative to a second bias point different from the first bias point to generate a second comparison output. The logic circuitry is connected to generate a signal bias monitor output signal based on the first and second comparison outputs, wherein (1) the signal bias monitor output signal has a first output value if the first and second comparison outputs are both equal to a first comparison result; (2) the signal bias monitor output signal has a second output value if the first and second comparison outputs are both equal to a second comparison result; (3) the signal bias monitor output signal changes from the first output value to the second output value only after the first and second comparison outputs both change from the first comparison result to the second comparison result; and (4) the signal bias monitor output signal changes from the second output value to the first output value only after the first and second comparison outputs both change from the second comparison result to the first comparison result.

In another embodiment of the present invention, signal bias is monitored in an integrated circuit. A first comparison output is generated by comparing first and second voltages relative to a first bias point. A second comparison output is generated by comparing the first and second voltages relative to a second bias point different from the first bias point. A signal bias monitor output signal is generated based on the first and second comparison outputs, wherein (1) the signal bias monitor output signal has a first output value if the first and second comparison outputs are both equal to a first comparison result; (2) the signal bias monitor output signal has a second output value if the first and second comparison outputs are both equal to a second comparison result; (3) the signal bias monitor output signal changes from the first output value to the second output value only after the first and second comparison outputs both change from the first comparison result to the second comparison result; and (4) the signal bias monitor output signal changes from the second output value to the first output value only after the first and second comparison outputs both change from the second comparison result to the first comparison result.

In yet another embodiment of the present invention, an integrated circuit has logic circuitry adapted to receive two or more input signals and generate an output signal. The logic circuitry comprises a logic-AND gate, a logic-OR gate, and a multiplexer. The logic-AND gate is connected to generate a first logic result by applying a logic-AND operation to the two or more input signals. The logic-OR gate is connected to generate a second logic result by applying a logic-OR operation to the two or more input signals. The multiplexer is connected to generate the output signal by selecting one of the first and second logic results based on an inverted version of the output signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
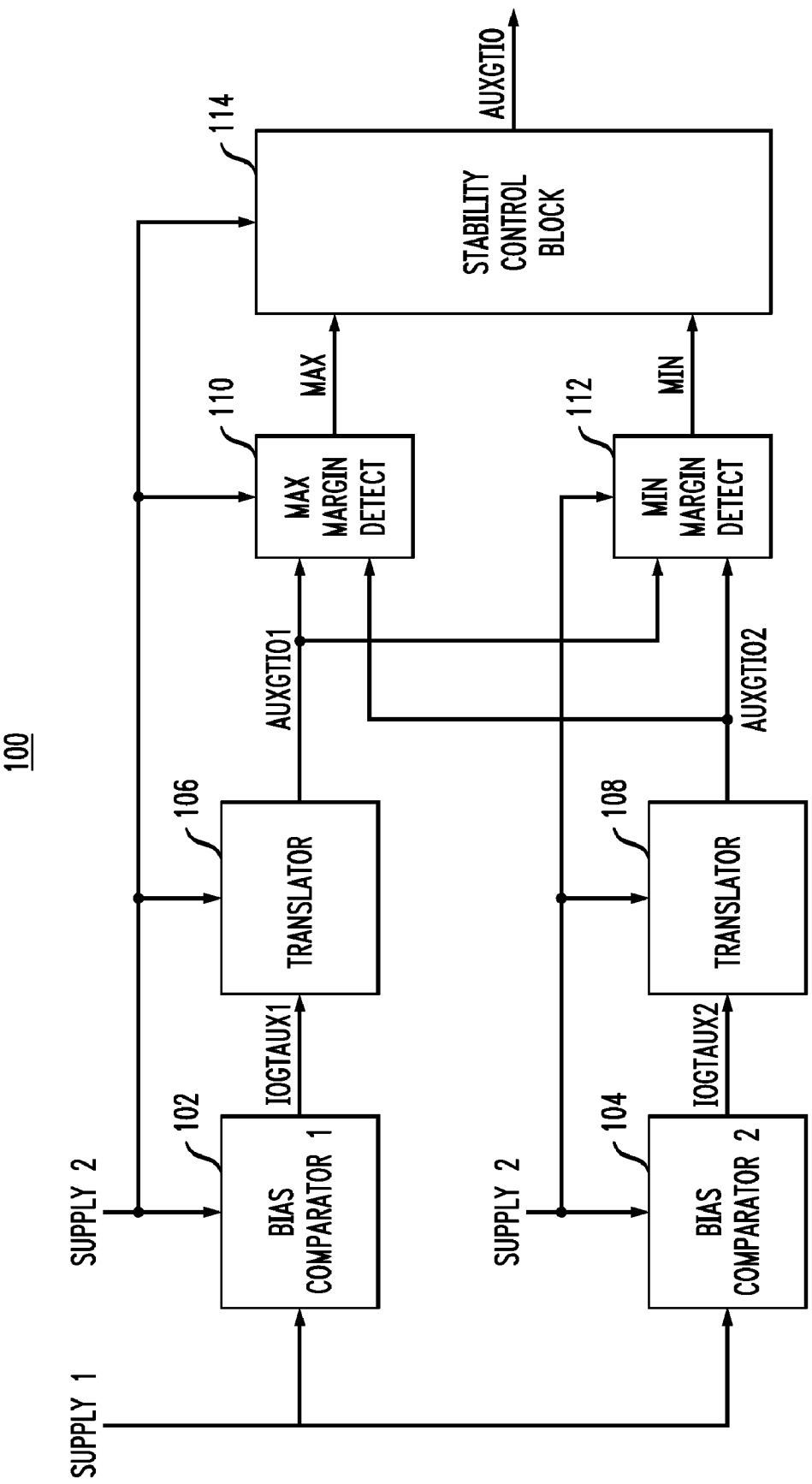
FIG. 1 shows a block diagram of a hysteresis-based signal bias monitor, according to one embodiment of the present invention.

FIG. 1 shows a block diagram of a hysteresis-based signal bias monitor 100, according to one embodiment of the present invention. Signal bias monitor 100 receives two analog power supply voltages VCCIO and VCCAUX, selects one of the two supply voltages, and generates a digital output signal AUXG-TIO indicative of that selection. In one implementation, AUXGTIO=1 indicates the selection of VCCAUX, while AUXGTIO=0 indicates the selection of VCCIO.

Signal bias monitor 100 comprises first and second bias comparators 102 and 104, two inverting voltage-domain translators 106 and 108, a maximum margin detector 110, a minimum margin detector 112, and a stability control block 114.

Each bias comparator 102/104 compares supply voltages VCCIO and VCCAUX relative to a different bias voltage and generates a digital signal IOGTAUXi indicative of the result of that comparison. For example, first bias comparator 102 determines whether VCCIO is greater than VCCAUX by more than a first threshold voltage THRESH1, where digital signal IOGTAUX1=1 indicates that VCCIO is greater than VCCAUX+THRESH1, and IOGTAUX1=0 indicates that VCCIO is not greater than VCCAUX+THRESH1. Similarly, second bias comparator 104 determines whether VCCIO is greater than VCCAUX by more than a second threshold voltage THRESH2, where digital signal IOGTAUX2=1 indicates that VCCIO is greater than VCCAUX+THRESH2, and IOGTAUX2=0 indicates that VCCIO is not greater than VCCAUX+THRESH2.

In one implementation of signal bias monitor 100, bias comparators 102 and 104 generate digital signals IOGTAUX1 and IOGTAUX2 in the VCCIO voltage domain. In certain applications, it is desired that the output of signal bias monitor 100 be in the VCCAUX voltage domain. As such, signal bias monitor 100 is depicted in FIG. 1 with inverting voltage-domain translators 106 and 108, which convert digital signals IOGTAUX1 and IOGTAUX2 from the VCCIO voltage domain into the VCCAUX voltage domain in an inverting manner.

In particular, inverting voltage-domain translator 106 converts VCCIO-domain signal IOGTAUX1 into VCCAUX-domain signal AUXGTIO1, where AUXGTIO1=1 indicates that VCCIO is not greater than VCCAUX+THRESH1, and AUXGTIO1=0 indicates that VCCIO is greater than VCCAUX+THRESH1. Similarly, inverting voltage-domain translator 108 converts VCCIO-domain signal IOGTAUX2 into VCCAUX-domain signal AUXGTIO2, where AUXGTIO2=1 indicates that VCCIO is not greater than VCCAUX+THRESH2, and AUXGTIO2=0 indicates that VCCIO is greater than VCCAUX+THRESH2.

Those skilled in the art will appreciate that, in other implementations, bias comparators 102 and 104 are designed to generate signals in the VCCAUX domain. In such implementations, translators 106 and 108 may be omitted. Similarly, in still other implementations, the output of signal bias monitor 100 is in the VCCIO domain. In such other implementations, translators 106 and 108 may also be omitted. Implementations that omit translators 106 and 108 would be designed to take into account the inversion of digital signals IOGTAUX1 and IOGTAUX2 in the embodiment of FIG. 1, e.g., by re-designing blocks 110, 112, and 114 to work directly with the un-inverted IOGTAUX1 and IOGTAUX2 signals or by replacing inverting voltage-domain translators 106 and 108 with relatively simple inverters that do not translate to another voltage domain.

Referring again to the embodiment of FIG. 1, Table I shows a logic table corresponding to an implementation of signal bias monitor 100 in which THRESH1 is greater than THRESH2 and to a scenario in which VCCAUX starts out (at Step 1) significantly lower than VCCIO (relative to the magnitudes of THRESH1 and THRESH2), VCCAUX rises relative to VCCIO to be significantly higher than VCCIO (by Step 3), and then VCCAUX drops relative to VCCIO to be again significantly lower than VCCIO (by Step 5). It should be understood, for example, that VCCAUX rising relative to VCCIO may result from different situations. For example, VCCAUX may be increasing, while VCCIO is static, as depicted in Table I. Alternatively, VCCAUX may be increasing faster than VCCIO is increasing. Alternatively, VCCAUX may be static, while VCCIO is decreasing. All of these situations will result in VCCAUX rising relative to VCCIO. Analogous situations apply to VCCAUX dropping relative to VCCIO.

TABLE I

Logic Table for Signal Bias Monitor 100

| Step | vccio | vccaux | IOGTAUX1 | IOGTAUX2 | AUXGTIO1 | AUXGTIO2 | AUXGTIO |
|---|---|---|---|---|---|---|---|
| 1 | 3.0 V | 2.4 V | 1 | 1 | 0 | 0 | 0 |
| 2 | 3.0 V | 2.8 V | 0 | 1 | 1 | 0 | 0 |
| 3 | 3.0 V | 3.2 V | 0 | 0 | 1 | 1 | 1 |
| 4 | 3.0 V | 2.8 V | 0 | 1 | 1 | 0 | 1 |
| 5 | 3.0 V | 2.4 V | 1 | 1 | 0 | 0 | 0 |

For the particular scenario depicted in Table I, THRESH1=0.5V, THRESH2=0V, VCCIO starts and stays at 3.0V, while VCCAUX starts at 2.4V, rises to 3.2V, and again drops to 2.4V. The purpose of this scenario is to illustrate the functionality of signal bias monitor 100; this scenario does not necessarily represent a realistic situation vis a vis power supplies VCCIO and VCCAUX.

In addition to the voltage levels of VCCIO and VCCAUX, Table I identifies the logical outputs of bias comparators 102 and 104 (i.e., IOGTAUX1 and IOGTAUX2) and translators 106 and 108 (i.e., AUXGTIO1 and AUXGTIO2). Table I also identifies the desired values for digital output signal AUXGTIO for the different steps in the scenario, where AUXGTIO is generated by the combination of max and min margin detectors 110 and 112 and stability control block 114.

For threshold values THRESH1=0.5V and THRESH2=0V:
  If VCCIO>VCCAUX+(0.5V), then IOGTAUX1=1 and AUXGTIO1=0, else IOGTAUX1=0 and AUXGTIO1=1; and
  If VCCIO>VCCAUX, then IOGTAUX2=1 and AUXGTIO2=0, else IOGTAUX2=0 and AUXGTIO2=1.

At Step 1, VCCAUX is sufficiently lower than VCCIO such that VCCIO is greater than both VCCAUX+(0.5V) and VCCAUX. In that case, IOGTAUX1 and IOGTAUX2 are both logic 1, and therefore AUXGTIO1 and AUXGTIO2 are both logic 0.

By Step 2, VCCAUX has sufficiently risen relative to VCCIO such that VCCIO is still greater than VCCAUX, but VCCIO is not greater than VCCAUX+(0.5V). In that case, IOGTAUX1 is now at logic 0, while IOGTAUX2 remains at logic 1, and therefore AUXGTIO1 is now at logic 1, while AUXGTIO2 remains at logic 0.

By Step 3, VCCAUX has sufficiently risen relative to VCCIO such that VCCIO is not greater than either VCCAUX or VCCAUX+(0.5V). In that case, IOGTAUX1 and IOGTAUX2 are both at logic 0, and therefore AUXGTIO1 and AUXGTIO2 are both logic 1.

By Step 4, VCCAUX has sufficiently dropped relative to VCCIO such that VCCIO is again greater than VCCAUX, while VCCIO is not greater than VCCAUX+(0.5V). As in Step 2, IOGTAUX1 is at logic 0, while IOGTAUX2 is at logic 1, and therefore AUXGTIO1 is at logic 1, while AUXGTIO2 is at logic 0.

By Step 5, VCCAUX has sufficiently dropped relative to VCCIO such that VCCIO is again greater than both VCCAUX and VCCAUX+(0.5V). As in Step 1, IOGTAUX1 and IOGTAUX2 are both logic 1, and therefore AUXGTIO1 and AUXGTIO2 are both logic 0.

In order to decrease noise in output signal AUXGTIO resulting from VCCIO and VCCAUX oscillating about a single bias point, signal bias monitor 100 is designed to prevent output signal AUXGTIO from changing value until the change in the relative values of VCCIO and VCCAUX is sufficiently large. Rather than permanently biasing the monitor towards one of the two power supplies as in the prior art, signal bias monitor 100 is designed with hysteresis that essentially biases the monitor towards its current output value. In particular, signal bias monitor 100 is designed to change the value of output signal AUXGTIO only after the outputs of both bias comparators 102 and 104 have changed values.

Table I shows the desired values for digital output signal AUXGTIO for the tabulated scenario. Because the outputs of bias comparators 102 and 104 are both 1 at Step 1, it is desired that AUXGTIO be 0. Since, by Step 2, the output of only bias comparator 102 has changed (indicating a relatively small change in the relative magnitudes of VCCIO and VCCAUX), it is desired that AUXGTIO remain at 0. Since, by Step 3, the outputs of both bias comparators have changed (indicating a relatively large change in the relative magnitudes of VCCIO and VCCAUX), it is desired that AUXGTIO change to 1. Again, since, by Step 4, the output of only bias comparator 104 has changed (relative to Step 3), it is desired that AUXGTIO remain at 1. Again, since, by Step 5, the outputs of both bias comparators have changed (relative to Step 3), it is desired that AUXGTIO change to 0. Note that, although the values of VCCIO and VCCAUX are the same for Steps 2 and 4, the values for AUXGTIO are different, due to their different preceding states. This characteristic demonstrates the hysteresis-based processing of signal bias monitor 100.

Note further that, if the values of VCCIO and VCCAUX were to oscillate about either of the two bias points of signal bias monitor 100 (i.e., 0V and 0.5V) by a relatively small amount (e.g., less than the magnitude of the difference between the two bias points, i.e., 0.5V), then the value of AUXGTIO will remain constant.

As described further below in the conjunction with FIG. 5 and Table II, max and min margin detectors 110 and 112 and stability control block 114 are designed to provide the desired hysteresis-based processing of signal bias monitor 100 to generate the values of AUXGTIO listed in Table I.

Figure 2:
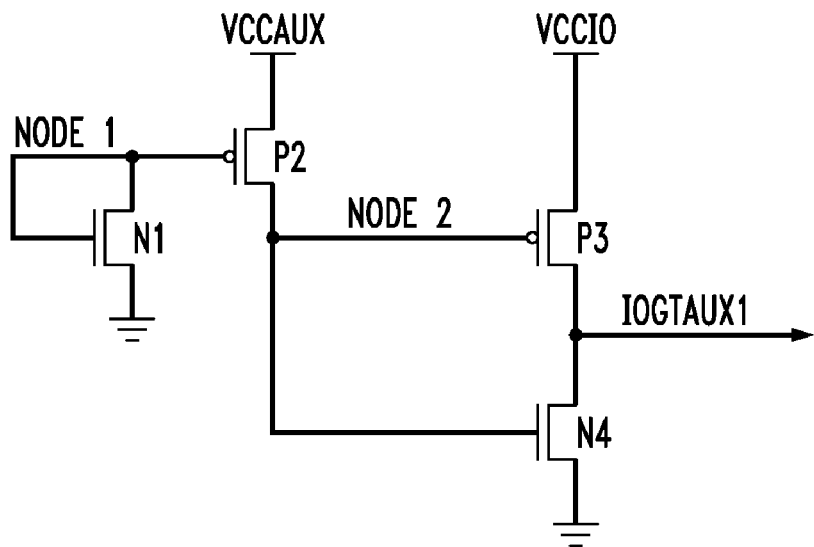
FIG. 2 shows a schematic diagram of a circuit that can be used to implement the first bias comparator of FIG. 1.

FIG. 2 shows a schematic diagram of a circuit that can be used to implement first bias comparator 102 of FIG. 1. In this implementation of first bias comparator 102:

NFET N1 is diode-connected to keep the gate of PFET P2 low and thereby keep P2 on and drive the gates of PFET P3 and NFET N4 towards VCCAUX;

P3 is relatively strong and fast compared to N4, which is relatively weak with a relatively high impedance (to save power); and THRESH1 is equal to the threshold voltage Vtp3 of P3.

During typical power-on scenarios in which VCCAUX and VCCIO rise to their steady-state values, NFET N4 will turn on and stay on as soon as the gate voltage applied to N4 rises above the turn-on threshold voltage for N4 relative to ground. During such a power-on scenario, if VCCIO is greater than VCCAUX by more than Vtp3 (i.e., VCCIO>VCCAUX+Vtp3), then P3 will be on. As a result, P3 will overpower the relatively weak N4 to drive IOGTAUX1 towards VCCIO (i.e., logic 1 in the VCCIO voltage domain). If VCCIO is not greater than VCCAUX by more than Vtp3 (i.e., VCCIO≯VCCAUX+Vtp3), then P3 will be off. In that case, N4 will drive IOGTAUX1 towards ground (i.e., logic 0 in the VCCIO voltage domain). P2 shields the gates of P3 and N4 from direct power-supply connections to protect the gates from electro-static discharge (ESD) events that can break down gate oxides. For the exemplary implementation described earlier, to achieve THRESH1=0.5V, PFET P3 is designed to have a threshold voltage Vtp3 of 0.5V.

Figure 3:
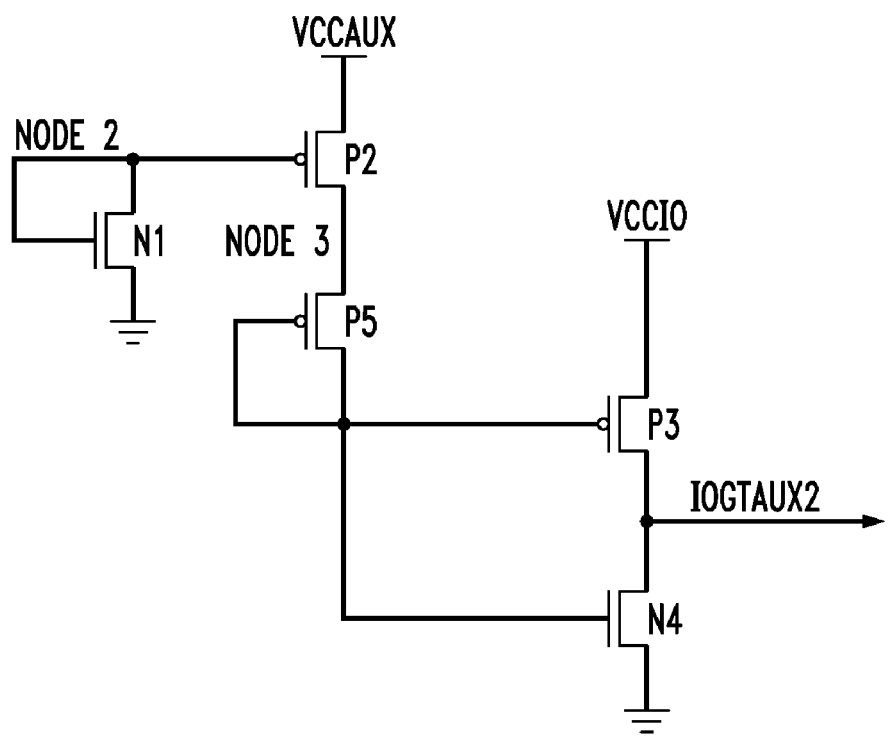
FIG. 3 shows a schematic diagram of a circuit that can be used to implement the second bias comparator of FIG. 1.

FIG. 3 shows a schematic diagram of a circuit that can be used to implement second bias comparator 104 of FIG. 1. In this implementation of second bias comparator 104:

NFET N1 is diode-connected to keep the gate of PFET P2 low and thereby keep P2 on;

PFET P3 is relatively strong and fast compared to NFET N4, which is relatively weak with a relatively high impedance (to save power); and PFET P5 lowers the voltage at the gate of P3 by the threshold voltage Vtp5 of P5, such that THRESH2 is equal to the threshold voltage Vtp3 of PFET P3 minus the threshold voltage Vtp5 of P5.

As in FIG. 2, during typical power-on scenarios in which VCCAUX and VCCIO rise to their steady-state values, NFET N4 of FIG. 3 will turn on and stay on as soon as the gate voltage applied to N4 rises above the turn-on threshold voltage for N4 relative to ground. During such a power-on scenario, if VCCIO is greater than VCCAUX by more than Vtp3 minus Vtp5 (i.e., VCCIO>VCCAUX+Vtp3-Vtp5), then P3 will be on. As a result, P3 will overpower the relatively weak N4 to drive IOGTAUX2 towards VCCIO (i.e., logic 1 in the VCCIO voltage domain). If VCCIO is not greater than VCCAUX by more than Vtp3 minus Vtp5 (i.e., VCCIO≯VCCAUX+Vtp3-Vtp5), then P3 will be off. In that case, N4 will drive IOGTAUX2 will be driven towards ground (i.e., logic 0 in the VCCIO voltage domain). Similar to FIG. 2, P2 and P5 shield the gates of P3 and N4 from direct power-supply connections to protect the gates from ESD events that can break down gate oxides. For the exemplary implementation described earlier, to achieve THRESH2=0V, PFETs P3 and P5 are designed to have equal threshold voltages.

Figure 4:
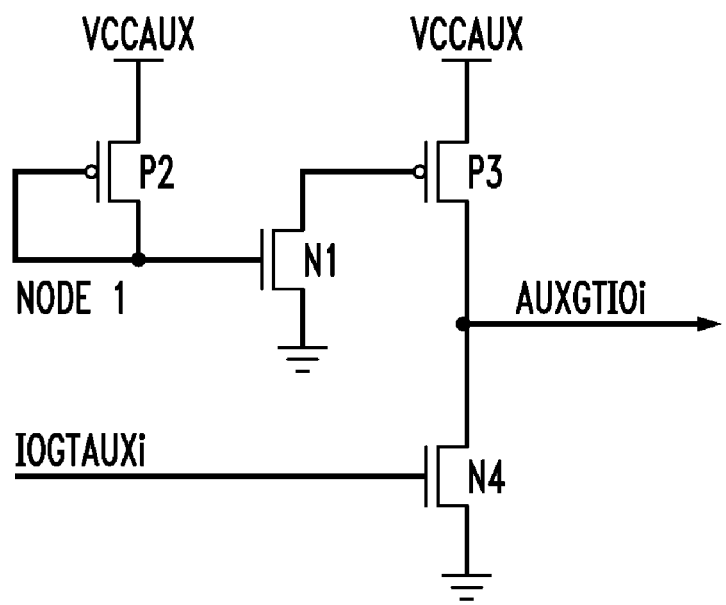
FIG. 4 shows a schematic diagram of a circuit that can be used to implement each of the inverting voltage-domain translators of FIG. 1.

FIG. 4 shows a schematic diagram of an inverting voltage-domain translator 400 that can be used to implement each of inverting voltage-domain translators 106 and 108 of FIG. 1. In particular, translator 400 receives IOGTAUXi in the VCCIO voltage domain and generates AUXGTIOi in the VCCAUX domain, such that, if IOGTAUXi is high, then AUXGTIOi is low, and vice versa. In this implementation of an inverting voltage-domain translator:

PFET P2 is diode-connected to keep P2 on, thereby driving the gate of NFET N1 high (i.e., towards VCCAUX) to turn on N1, which in turn drives the gate of PFET P3 low to turn on P3; and NFET N4 is relatively strong and fast compared to P3, which is relatively weak with a relatively high impedance (to save power).

If IOGTAUXi is high (e.g., VCCIO), then N4 is on and AUXGTIOi is driven towards ground (i.e., logic 0). If IOGTAUXi is low, then N4 is off and AUXGTIOi is driven towards VCCAUX (i.e., logic 1 in the VCCAUX voltage domain).

Figure 5:
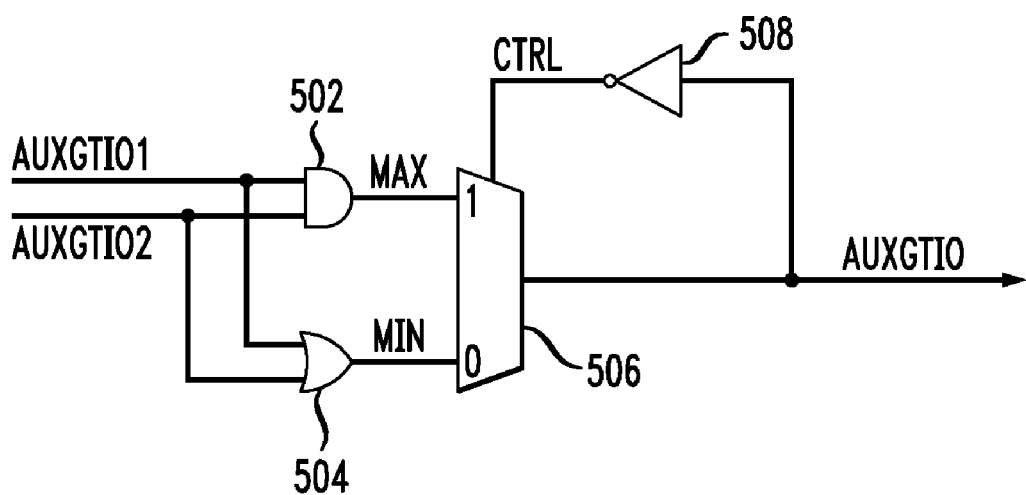
FIG. 5 shows a schematic diagram of a circuit that can be used to implement the maximum margin detector, the minimum margin detector, and the stability control block of FIG. 1.

FIG. 5 shows a schematic diagram of a logic circuit 500 that can be used to implement maximum margin detector 110, minimum margin detector 112, and stability control block 114 of FIG. 1. Logic circuit 500, which comprises logic-AND gate 502, logic-OR gate 504, (2×1) mux 506, and inverter 508, receives AUXGTIO1 from translator 106 and AUXGTIO2 from translator 108 and generates the signal bias monitor output signal AUXGTIO. AND gate 502 applies the logic-AND function to AUXGTIO1 and AUXGTIO2 to generate max signal MAX. OR gate 504 applies the logic-OR function to AUXGTIO1 and AUXGTIO2 to generate min signal MIN. Mux 506 selects one of MAX and MIN to output as AUXGTIO based on mux control signal CTRL, which is an inverted version of output signal AUXGTIO.

Table II shows a truth table of the operations of logic circuit 500 for the same scenario shown in Table I. In this scenario, mux control signal CTRL is initialized to a value of 1 to select the max signal MAX as an initial default for logic circuit 500. At Step 1, CTRL=1 causes mux 506 to select the value of MAX for AUXGTIO. By Step 2, although the value MIN has changed, the value of MAX has not changed. Since mux 506 is still selecting MAX due to the previous value of 1 for CTRL, AUXGTIO and CTRL remain as in Step 1. By Step 3, the value of MAX changes to 1, which causes AUXGTIO to change to 1 (since mux 506 is still selecting MAX due to the previous value of 1 for CTRL), which in turn causes inverter 508 to change CTRL to 0 to select MIN, which also has a value of 1, thereby keeping AUXGTIO at 1. By Step 4, although the value of MAX has changed, the value of MIN has not changed. Since mux 506 is still selecting MIN due to the previous value of 0 for CTRL, AUXGTIO and CTRL remain as in Step 3. By Step 5, the value of MIN changes to 0, which causes AUXGTIO to change to 0 (since mux 506 is still selecting MIN due to the previous value of 0 for CTRL), which in turn causes inverter 508 to change CTRL to 1 to select MAX, which also has a value of 0, thereby keeping AUXGTIO at 0.

TABLE II

Logic Table for Logic Circuit 500

| Step | AUXGTIO1 | AUXGTIO2 | MAX | MIN | AUXGTIO | CTRL |
|---|---|---|---|---|---|---|
| 1 | 0 | 0 | 0 | 0 | 0 | 1 |
| 2 | 1 | 0 | 0 | 1 | 0 | 1 |
| 3 | 1 | 1 | 1 | 1 | 1 | 0 |
| 4 | 1 | 0 | 0 | 1 | 1 | 0 |
| 5 | 0 | 0 | 0 | 0 | 0 | 1 |

Although the present invention has been described in the context of an implementation of signal bias monitor 100 of FIG. 1, in which THRESH1 is 0.5V and THRESH2 is 0V, the present invention can also be implemented using other values for THRESH1 and/or THRESH2, including implementations in which THRESH2 is greater than THRESH1.

Although the present invention has been described in the context of a signal bias monitor that monitors power supply voltages, the present invention can also be implemented in the context of signal bias monitors that monitor voltages other than power supply voltages. For example, the present invention can be implemented in the context of comparators for analog-to-digital converters.

Although the present invention has been described in the context of a signal bias monitor having hysteresis-based processing, the architecture of FIG. 5 can be used to implement hysteresis-based processing in other contexts, where hysteresis-based processing is applied to two or more input signals to generate an output signal, in which the output signal changes value only after all of the input signals change value. The architecture of FIG. 5 can be extended to N>2 input signals by replacing the 2-input AND and OR gates with N-input AND and OR gates, respectively. In general, hysteresis-based processing according to the present invention can be applied to any handshaking application in which the outputs from all of two or more different processing elements (such as the bias comparators of FIG. 1) must change before the output from the hysteresis-based processing will change.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MPGAs), simple programmable logic devices (SPLDs), and complex programmable logic devices (CPLDs).

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device if the present invention is implemented using bi-polar transistor technology.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An integrated circuit having a signal bias monitor comprising:
 a first bias comparator connected to compare first and second voltages relative to a first bias point to generate a first comparison output;
 a first voltage-domain translator connected to convert the first comparison output from a first voltage domain to a second voltage domain;
 a second bias comparator connected to compare the first and second voltages relative to a second bias point different from the first bias point to generate a second comparison output;
 a second voltage-domain translator connected to convert the second comparison output from the first voltage domain to the second voltage domain; and
 logic circuitry connected to generate a signal bias monitor output signal based on the first and second comparison outputs in the second voltage domain, wherein:
  the signal bias monitor output signal has a first output value when the first and second comparison outputs are both equal to a first comparison result;
  the signal bias monitor output signal has a second output value when the first and second comparison outputs are both equal to a second comparison result;
  the signal bias monitor output signal changes from the first output value to the second output value only after the first and second comparison outputs both change from the first comparison result to the second comparison result; and
  the signal bias monitor output signal changes from the second output value to the first output value only after the first and second comparison outputs both change from the second comparison result to the first comparison result.

2. The invention of claim 1, wherein the logic circuitry implements hysteresis-based processing that prevents the signal bias monitor output signal from changing value if the first and second voltages vary from one of the first and second bias points by all magnitudes less than the difference between the first and second bias points.

3. The invention of claim 1, wherein the first and second voltage-domain translators are inverting voltage-domain translators.

4. The invention of claim 1, wherein:
 the logic circuitry is connected to receive two input signals corresponding to the first and second comparison outputs; and
 the logic circuitry comprises:
 a logic-AND gate connected to generate a first logic result by applying a logic-AND operation to the two input signals;
 a logic-OR gate connected to generate a second logic result by applying a logic-OR operation to the two input signals; and
 a multiplexer connected to generate the signal bias monitor output signal by selecting one of the first and second logic results based on an inverted version of the signal bias monitor output signal.

5. The invention of claim 1, wherein:
 the first and second voltages are power supply voltages; and
 the integrated circuit is an FPGA.

6. A method for monitoring signal bias in an integrated circuit, the method comprising:
 generating a first comparison output by comparing first and second voltages relative to a first bias point;
 converting the first comparison output from a first voltage domain to a second voltage domain;
 generating a second comparison by comparing the first and second voltages relative to a second bias point different from the first bias point;
 converting the second comparison output from the first voltage domain to the second voltage domain; and
 generating a signal bias monitor output signal based on the first and second comparison outputs in the second voltage domain, wherein:
 the signal bias monitor output signal has a first output value when the first and second comparison outputs are both equal to a first comparison result;
 the signal bias monitor output signal has a second output value when the first and second comparison outputs are both equal to a second comparison result;
 the signal bias monitor output signal changes from the first output value to the second output value only after the first and second comparison outputs both change from the first comparison result to the second comparison result; and
 the signal bias monitor output signal changes from the second output value to the first output value only after the first and second comparison outputs both change from the second comparison result to the first comparison result.

7. The invention of claim 6, wherein converting the first and second comparison outputs from the first voltage domain to the second voltage domain involves inverting the first and second comparison outputs.

8. The invention of claim 6, wherein generating a signal bias monitor output signal comprises:
   generating a first logic result by applying a logic-AND operation to two input signals corresponding to the first and second comparison outputs; and
   generating a second logic result by applying a logic-OR operation to the two input signals; and
   generating the signal bias monitor output signal by selecting one of the first and second logic results based on an inverted version of the signal bias monitor output signal.

9. The invention of claim 6, wherein:
   the first and second voltages are power supply voltages; and
   the method is implemented in an FPGA.

10. An integrated circuit having a signal bias monitor comprising:
    a first bias comparator connected to compare first and second voltages relative to a first bias point to generate a first comparison output;
    a first voltage-domain translator connected to convert the first comparison output from a first voltage domain to a second voltage domain;
    a second bias comparator connected to compare the first and second voltages relative to a second bias point different from the first bias point to generate a second comparison output;
    a second voltage-domain translator connected to convert the second comparison output from the first voltage domain to the second voltage domain; and
    logic circuitry connected to generate a signal bias monitor output signal based on the first and second comparison outputs in the second voltage domain, wherein the logic circuitry implements hysteresis-based processing.

* * * * *